(12) United States Patent
Gleason et al.

(10) Patent No.: US 7,271,603 B2
(45) Date of Patent: Sep. 18, 2007

(54) SHIELDED PROBE FOR TESTING A DEVICE UNDER TEST

(75) Inventors: K. Reed Gleason, Portland, OR (US); Tim Lesher, Portland, OR (US); Mike Andrews, Cornelius, OR (US); John Martin, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/391,895

(22) Filed: Mar. 28, 2006

(65) Prior Publication Data

US 2006/0170439 A1    Aug. 3, 2006

Related U.S. Application Data

(63) Continuation of application No. 10/445,174, filed on May 23, 2003, now Pat. No. 7,057,404.

(51) Int. Cl.
*G01R 31/02* (2006.01)

(52) U.S. Cl. ........................... 324/754; 324/762

(58) Field of Classification Search ........ 324/754–762, 324/72.5; 439/482; 333/246–248
See application file for complete search history.

(56) References Cited

U.S. PATENT DOCUMENTS

| 491,783 A | 2/1893 | Moyer |
|---|---|---|
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 3,218,584 A | 11/1965 | Ayer |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |

(Continued)

FOREIGN PATENT DOCUMENTS

DE    3637549    5/1988

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Vinh P. Nguyen
(74) *Attorney, Agent, or Firm*—Chernoff, Vilhauer, McClung & Stenzel (57) ABSTRACT

A probe measurement system for measuring the electrical characteristics of integrated circuits or other microelectronic devices at high frequencies. The probe measurement system preferably includes a probe having a conductive path extending between the first and second surfaces of a membrane and a probe contact electrically connected to the conductive path.

53 Claims, 4 Drawing Sheets

U.S. PATENT DOCUMENTS

| | | |
|---|---|---|
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,725,829 A | 4/1973 | Brown |
| 3,740,900 A | 6/1973 | Youmans et al. |
| 3,766,470 A | 10/1973 | Hay et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,862,790 A | 1/1975 | Davies et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,971,610 A | 7/1976 | Buchoff et al. |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,074,201 A | 2/1978 | Lennon |
| 4,116,523 A | 9/1978 | Coberly |
| 4,123,706 A | 10/1978 | Roch |
| 4,124,787 A | 11/1978 | Aamoth et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,280,112 A | 7/1981 | Eisenhart |
| 4,284,033 A | 8/1981 | del Rio |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,340,860 A | 7/1982 | Teeple, Jr. |
| 4,346,355 A | 8/1982 | Tsukii |
| 4,375,631 A | 3/1983 | Goldberg |
| 4,593,243 A * | 6/1986 | Lao et al. .................... 324/754 |
| 4,641,659 A | 2/1987 | Sepponen |
| 4,646,005 A | 2/1987 | Ryan |
| 4,649,339 A | 3/1987 | Grangroth et al. |
| 4,652,082 A | 3/1987 | Warner |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Boegh-Petersen |
| 4,714,873 A | 12/1987 | McPherson et al. |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,746,857 A | 5/1988 | Sakai et al. |
| 4,749,942 A | 6/1988 | Sang et al. |
| 4,755,746 A | 7/1988 | Mallory et al. |
| 4,755,874 A | 7/1988 | Esrig et al. |
| 4,757,255 A | 7/1988 | Margozzi |
| 4,764,723 A | 8/1988 | Strid |
| 4,772,846 A | 9/1988 | Reeds |
| 4,780,670 A | 10/1988 | Cherry |
| 4,783,625 A | 11/1988 | Harry et al. |
| 4,788,851 A | 12/1988 | Brault |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,810,981 A | 3/1989 | Herstein |
| 4,818,059 A | 4/1989 | Kakii et al. |
| 4,827,211 A | 5/1989 | Strid et al. |
| 4,835,495 A | 5/1989 | Simonutti |
| 4,837,507 A | 6/1989 | Hechtman |
| 4,849,689 A | 7/1989 | Gleason et al. |
| 4,853,624 A | 8/1989 | Rabjohn |
| 4,853,627 A | 8/1989 | Gleason et al. |
| 4,858,160 A | 8/1989 | Strid et al. |
| 4,864,227 A | 9/1989 | Sato |
| 4,871,964 A | 10/1989 | Boll et al. |
| 4,888,550 A | 12/1989 | Reid |
| 4,891,584 A | 1/1990 | Kamieniecki et al. |
| 4,893,914 A | 1/1990 | Hancock et al. |
| 4,894,612 A | 1/1990 | Drake et al. |
| 4,899,126 A | 2/1990 | Yamada |
| 4,899,998 A | 2/1990 | Feramachi |
| 4,901,012 A | 2/1990 | Gloanec et al. |
| 4,904,933 A | 2/1990 | Snyder et al. |
| 4,906,920 A | 3/1990 | Huff et al. |
| 4,908,570 A | 3/1990 | Gupta et al. |
| 4,912,399 A | 3/1990 | Greub et al. |
| 4,916,002 A | 4/1990 | Carver |
| 4,918,373 A | 4/1990 | Newberg |
| 4,918,383 A | 4/1990 | Huff et al. |
| 4,922,186 A | 5/1990 | Tsuchiya et al. |
| 4,922,912 A | 5/1990 | Watanabe |
| 4,926,172 A | 5/1990 | Gorsek |
| 4,970,386 A | 11/1990 | Buck |
| 4,972,073 A | 11/1990 | Lessing |
| 4,975,638 A | 12/1990 | Evans et al. |
| 4,980,637 A | 12/1990 | Huff et al. |
| 4,983,910 A | 1/1991 | Majidi-Ahy et al. |
| 4,987,100 A | 1/1991 | McBride et al. |
| 4,988,062 A | 1/1991 | London |
| 4,991,290 A | 2/1991 | MacKay |
| 4,998,062 A | 3/1991 | Ikeda |
| 4,998,063 A | 3/1991 | Miller |
| 5,001,423 A | 3/1991 | Abrami |
| 5,003,253 A | 3/1991 | Majidi-Ahy et al. |
| 5,020,219 A | 6/1991 | Leedy |
| 5,021,186 A | 6/1991 | Ota et al. |
| 5,030,907 A | 7/1991 | Yih et al. |
| 5,045,781 A | 9/1991 | Gleason et al. |
| 5,059,898 A | 10/1991 | Barsotti et al. |
| 5,061,192 A | 10/1991 | Chapin et al. |
| 5,069,628 A | 12/1991 | Crumly |
| 5,089,774 A | 2/1992 | Nakano |

| Patent | Date | Inventor |
|---|---|---|
| 5,091,692 A | 2/1992 | Ohno et al. |
| 5,097,101 A | 3/1992 | Trobough |
| 5,097,207 A | 3/1992 | Blanz |
| 5,101,453 A | 3/1992 | Rumbaugh |
| 5,116,180 A | 5/1992 | Fung et al. |
| 5,126,286 A | 6/1992 | Chance |
| 5,126,696 A | 6/1992 | Grote et al. |
| 5,133,119 A | 7/1992 | Afshari et al. |
| 5,134,365 A | 7/1992 | Okubo et al. |
| 5,136,237 A | 8/1992 | Smith et al. |
| 5,138,289 A | 8/1992 | McGrath |
| 5,145,552 A | 9/1992 | Yoshizawa et al. |
| 5,148,131 A | 9/1992 | Amboss et al. |
| 5,159,264 A | 10/1992 | Anderson |
| 5,159,267 A | 10/1992 | Anderson |
| 5,159,752 A | 11/1992 | Mahant-Shetti et al. |
| 5,172,050 A | 12/1992 | Swapp |
| 5,172,051 A | 12/1992 | Zamborelli |
| 5,177,438 A | 1/1993 | Littlebury et al. |
| 5,180,977 A | 1/1993 | Huff |
| 5,202,558 A | 4/1993 | Barker |
| 5,202,648 A | 4/1993 | McCandless |
| 5,207,585 A | 5/1993 | Byrnes et al. |
| 5,225,037 A | 7/1993 | Eldu et al. |
| 5,232,789 A | 8/1993 | Platz et al. |
| 5,233,197 A | 8/1993 | Bowman et al. |
| 5,266,963 A | 11/1993 | Carter |
| 5,267,088 A | 11/1993 | Nomura |
| 5,270,664 A | 12/1993 | McMurty et al. |
| 5,274,336 A | 12/1993 | Crook et al. |
| 5,289,117 A | 2/1994 | Van Loan et al. |
| 5,293,175 A | 3/1994 | Hemmie et al. |
| 5,298,972 A | 3/1994 | Heffner |
| 5,313,157 A | 5/1994 | Pasiecznik, Jr. |
| 5,315,237 A | 5/1994 | Iwakura et al. |
| 5,316,435 A | 5/1994 | Monzingo |
| 5,317,656 A | 5/1994 | Moslehi et al. |
| 5,321,352 A | 6/1994 | Takebuchi |
| 5,321,453 A | 6/1994 | Mori et al. |
| 5,326,412 A | 7/1994 | Schreiber et al. |
| 5,334,931 A | 8/1994 | Clarke et al. |
| 5,347,204 A | 9/1994 | Gregory et al. |
| 5,355,079 A | 10/1994 | Evans et al. |
| 5,360,312 A | 11/1994 | Mozingo |
| 5,361,049 A | 11/1994 | Rubin et al. |
| 5,367,165 A | 11/1994 | Toda et al. |
| 5,371,654 A | 12/1994 | Beaman et al. |
| 5,373,231 A | 12/1994 | Boll et al. |
| 5,376,790 A | 12/1994 | Linker et al. |
| 5,383,787 A | 1/1995 | Switky et al. |
| 5,389,885 A | 2/1995 | Swart |
| 5,395,253 A | 3/1995 | Crumly |
| 5,404,111 A | 4/1995 | Mori et al. |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,430,813 A | 7/1995 | Anderson et al. |
| 5,441,690 A | 8/1995 | Ayala-Esquilin et al. |
| 5,453,404 A | 9/1995 | Leedy |
| 5,463,324 A | 10/1995 | Wardwell et al. |
| 5,467,024 A | 11/1995 | Swapp |
| 5,475,316 A | 12/1995 | Hurley et al. |
| 5,476,211 A | 12/1995 | Khandros |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,493,236 A | 2/1996 | Ishii et al. |
| 5,505,150 A | 4/1996 | James et al. |
| 5,506,515 A | 4/1996 | Godshalk et al. |
| 5,507,652 A | 4/1996 | Wardwell |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,530,372 A | 6/1996 | Lee et al. |
| 5,531,022 A | 7/1996 | Beaman et al. |
| 5,532,608 A | 7/1996 | Behfar-Rad et al. |
| 5,537,372 A | 7/1996 | Albrecht et al. |
| 5,550,481 A | 8/1996 | Holmes et al. |
| 5,565,788 A | 10/1996 | Burr et al. |
| 5,571,324 A | 11/1996 | Sago et al. |
| 5,578,932 A | 11/1996 | Adamian |
| 5,584,120 A | 12/1996 | Roberts |
| 5,589,781 A | 12/1996 | Higgens et al. |
| 5,594,358 A | 1/1997 | Ishikawa et al. |
| 5,601,740 A | 2/1997 | Eldridge et al. |
| 5,610,529 A | 3/1997 | Schwindt |
| 5,611,008 A | 3/1997 | Yap |
| 5,617,035 A | 4/1997 | Swapp |
| 5,621,333 A | 4/1997 | Long et al. |
| 5,621,400 A | 4/1997 | Corbi |
| 5,623,213 A | 4/1997 | Liu et al. |
| 5,623,214 A | 4/1997 | Pasiecznik, Jr. |
| 5,627,473 A | 5/1997 | Takami |
| 5,633,780 A | 5/1997 | Cronin |
| 5,635,846 A | 6/1997 | Beaman et al. |
| 5,642,298 A | 6/1997 | Mallory et al. |
| 5,644,248 A | 7/1997 | Fujimoto |
| 5,656,942 A | 8/1997 | Watts et al. |
| 5,659,421 A | 8/1997 | Rahmel et al. |
| 5,666,063 A | 9/1997 | Abercrombie et al. |
| 5,669,316 A | 9/1997 | Faz et al. |
| 5,670,888 A | 9/1997 | Cheng |
| 5,672,816 A | 9/1997 | Park et al. |
| 5,675,499 A | 10/1997 | Lee et al. |
| 5,676,360 A | 10/1997 | Boucher et al. |
| 5,685,232 A | 11/1997 | Inoue |
| 5,686,317 A | 11/1997 | Akram et al. |
| 5,688,618 A | 11/1997 | Hulderman et al. |
| 5,700,844 A | 12/1997 | Hederick et al. |
| 5,704,355 A | 1/1998 | Bridges |
| 5,715,819 A | 2/1998 | Svenson et al. |
| 5,720,098 A | 2/1998 | Kister |
| 5,723,347 A | 3/1998 | Kirano et al. |
| 5,726,211 A | 3/1998 | Hedrick et al. |
| 5,728,091 A | 3/1998 | Payne et al. |
| 5,729,150 A | 3/1998 | Schwindt |
| 5,731,920 A | 3/1998 | Katsuragawa |
| 5,742,174 A | 4/1998 | Kister et al. |
| 5,748,506 A | 5/1998 | Bockelman |
| 5,756,021 A | 5/1998 | Bedrick et al. |
| 5,756,908 A | 5/1998 | Knollmeyer et al. |
| 5,767,690 A | 6/1998 | Fujimoto |
| 5,772,451 A | 6/1998 | Dozier, II et al. |
| 5,773,780 A | 6/1998 | Eldridge et al. |
| 5,777,485 A | 7/1998 | Tanaka et al. |
| 5,785,538 A | 7/1998 | Beaman et al. |
| 5,794,133 A | 8/1998 | Kashima |
| 5,803,607 A | 9/1998 | Jones et al. |
| 5,804,607 A | 9/1998 | Hedrick et al. |
| 5,804,982 A | 9/1998 | Lo et al. |
| 5,804,983 A | 9/1998 | Nakajima et al. |
| 5,806,181 A | 9/1998 | Khandros et al. |
| 5,810,607 A | 9/1998 | Shih et al. |
| 5,811,751 A | 9/1998 | Leona et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,829,128 A | 11/1998 | Eldridge et al. |
| 5,829,437 A | 11/1998 | Bridges |
| 5,831,442 A | 11/1998 | Heigl |

| Patent No. | Date | Inventor |
|---|---|---|
| 5,832,601 A | 11/1998 | Eldridge et al. |
| 5,838,160 A | 11/1998 | Beaman et al. |
| 5,841,288 A | 11/1998 | Meaney et al. |
| 5,841,342 A | 11/1998 | Hegmann et al. |
| 5,852,871 A | 12/1998 | Khandros |
| 5,864,946 A | 2/1999 | Eldridge et al. |
| 5,869,974 A | 2/1999 | Akram et al. |
| 5,876,082 A | 3/1999 | Kempf et al. |
| 5,878,486 A | 3/1999 | Eldridge et al. |
| 5,879,289 A | 3/1999 | Yarush et al. |
| 5,883,522 A | 3/1999 | O'Boyle |
| 5,884,398 A | 3/1999 | Eldridge et al. |
| 5,892,539 A | 4/1999 | Colvin |
| 5,896,038 A | 4/1999 | Budnaitis et al. |
| 5,900,737 A | 5/1999 | Graham et al. |
| 5,900,738 A | 5/1999 | Khandros et al. |
| 5,905,421 A | 5/1999 | Oldfield |
| 5,912,046 A | 6/1999 | Eldridge et al. |
| 5,914,613 A | 6/1999 | Gleason et al. |
| 5,914,614 A | 6/1999 | Beaman et al. |
| 5,917,707 A | 6/1999 | Khandros et al. |
| 5,923,180 A | 7/1999 | Botka et al. |
| 5,926,029 A | 7/1999 | Ference et al. |
| 5,926,951 A | 7/1999 | Khandros et al. |
| 5,944,093 A | 8/1999 | Viswanath |
| 5,945,836 A | 8/1999 | Sayre et al. |
| 5,959,461 A | 9/1999 | Brown et al. |
| 5,963,364 A | 10/1999 | Leong et al. |
| 5,966,645 A | 10/1999 | Davis |
| 5,970,429 A | 10/1999 | Martin |
| 5,973,504 A | 10/1999 | Chong |
| 5,974,662 A | 11/1999 | Eldridge et al. |
| 5,982,166 A | 11/1999 | Mautz |
| 5,983,493 A | 11/1999 | Eldridge et al. |
| 5,994,152 A | 11/1999 | Khandros et al. |
| 5,998,228 A | 12/1999 | Eldridge et al. |
| 5,998,864 A | 12/1999 | Khandros et al. |
| 5,999,268 A | 12/1999 | Yonezawa et al. |
| 6,002,426 A | 12/1999 | Back et al. |
| 6,006,002 A | 12/1999 | Motok et al. |
| 6,023,103 A | 2/2000 | Chang et al. |
| 6,029,344 A | 2/2000 | Khandros et al. |
| 6,031,383 A | 2/2000 | Streib et al. |
| 6,032,356 A | 3/2000 | Eldridge et al. |
| 6,033,935 A | 3/2000 | Dozier, II et al. |
| 6,034,533 A | 3/2000 | Tervo et al. |
| 6,040,739 A | 3/2000 | Wedeen et al. |
| 6,042,712 A | 3/2000 | Mathieu |
| 6,043,563 A | 3/2000 | Eldridge et al. |
| 6,046,599 A | 4/2000 | Long et al. |
| 6,049,216 A | 4/2000 | Yang et al. |
| 6,049,976 A | 4/2000 | Khandros |
| 6,050,829 A | 4/2000 | Eldridge et al. |
| 6,052,653 A | 4/2000 | Mazur et al. |
| 6,054,651 A | 4/2000 | Fogel et al. |
| 6,059,982 A | 5/2000 | Palagonia et al. |
| 6,060,888 A | 5/2000 | Blackham et al. |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,071,009 A | 6/2000 | Clyne |
| 6,078,183 A | 6/2000 | Cole, Jr. |
| 6,078,500 A | 6/2000 | Beaman et al. |
| 6,090,261 A | 7/2000 | Mathieu |
| 6,091,256 A | 7/2000 | Long et al. |
| 6,096,567 A | 8/2000 | Kaplan et al. |
| 6,104,201 A | 8/2000 | Beaman et al. |
| 6,104,206 A | 8/2000 | Verkuil |
| 6,110,823 A | 8/2000 | Eldridge et al. |
| 6,114,864 A | 9/2000 | Soejima et al. |
| 6,118,287 A | 9/2000 | Boll et al. |
| 6,118,894 A | 9/2000 | Schwartz et al. |
| 6,124,725 A | 9/2000 | Sato |
| 6,127,831 A | 10/2000 | Khoury et al. |
| 6,130,536 A | 10/2000 | Powell et al. |
| 6,150,186 A | 11/2000 | Chen et al. |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,181,144 B1 | 1/2001 | Hembree et al. |
| 6,181,149 B1 | 1/2001 | Godfrey et al. |
| 6,181,416 B1 | 1/2001 | Falk |
| 6,184,053 B1 | 2/2001 | Eldridge et al. |
| 6,184,587 B1 | 2/2001 | Khandros et al. |
| 6,191,596 B1 | 2/2001 | Abiko |
| 6,206,273 B1 | 3/2001 | Beaman et al. |
| 6,208,225 B1 | 3/2001 | Miller |
| 6,211,663 B1 | 4/2001 | Moulthrop et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,789 B1 | 5/2001 | Schwindt |
| 6,233,613 B1 | 5/2001 | Walker et al. |
| 6,242,803 B1 | 6/2001 | Khandros et al. |
| 6,246,247 B1 | 6/2001 | Eldridge et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,281,691 B1 | 8/2001 | Matsunaga et al. |
| 6,286,208 B1 | 9/2001 | Shih et al. |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,339,338 B1 | 1/2002 | Eldridge et al. |
| 6,340,895 B1 | 1/2002 | Uher et al. |
| 6,351,885 B2 | 3/2002 | Suzuki et al. |
| 6,352,454 B1 | 3/2002 | Kim et al. |
| 6,384,614 B1 | 5/2002 | Hager et al. |
| 6,384,615 B2 | 5/2002 | Schwindt |
| 6,388,455 B1 | 5/2002 | Kamienniecki et al. |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,562 B1 | 6/2002 | Whiteman |
| 6,415,858 B1 | 7/2002 | Getchel et al. |
| 6,429,029 B1 | 8/2002 | Eldridge et al. |
| 6,441,315 B1 | 8/2002 | Eldridge et al. |

| | | | | | |
|---|---|---|---|---|---|
| 6,442,831 B1 | 9/2002 | Khandros et al. | 6,677,744 B1 | 1/2004 | Long |
| 6,448,788 B1 | 9/2002 | Meaney et al. | 6,678,850 B2 | 1/2004 | Roy et al. |
| 6,448,865 B1 | 9/2002 | Miller | 6,678,876 B2 | 1/2004 | Stevens et al. |
| 6,452,406 B1 | 9/2002 | Beaman et al. | 6,680,659 B2 | 1/2004 | Miller |
| 6,452,411 B1 | 9/2002 | Miller et al. | 6,685,817 B1 | 2/2004 | Mathieu |
| 6,456,099 B1 | 9/2002 | Eldridge et al. | 6,686,754 B2 | 2/2004 | Miller |
| 6,456,103 B1 | 9/2002 | Eldridge et al. | 6,690,185 B1 | 2/2004 | Khandros et al. |
| 6,459,343 B1 | 10/2002 | Miller | 6,701,265 B2 | 3/2004 | Hill et al. |
| 6,459,739 B1 | 10/2002 | Vitenberg | 6,701,612 B2 | 3/2004 | Khandros et al. |
| 6,468,098 B1 | 10/2002 | Eldridge | 6,708,403 B2 | 3/2004 | Beaman et al. |
| 6,475,822 B2 | 11/2002 | Eldridge | 6,710,798 B1 | 3/2004 | Hershel et al. |
| 6,476,333 B1 | 11/2002 | Khandros et al. | 6,713,374 B2 | 3/2004 | Eldridge et al. |
| 6,476,630 B1 | 11/2002 | Whitten et al. | 6,714,828 B2 | 3/2004 | Eldridge et al. |
| 6,479,308 B1 | 11/2002 | Eldridge | 6,717,426 B2 | 4/2004 | Iwasaki |
| 6,480,978 B1 | 11/2002 | Roy et al. | 6,720,501 B1 | 4/2004 | Henson |
| 6,481,939 B1 | 11/2002 | Gillespie et al. | 6,722,032 B2 | 4/2004 | Beaman et al. |
| 6,482,013 B2 | 11/2002 | Eldridge et al. | 6,724,205 B1 | 4/2004 | Hayden et al. |
| 6,483,327 B1 | 11/2002 | Bruce et al. | 6,724,928 B1 | 4/2004 | Davis |
| 6,488,405 B1 | 12/2002 | Eppes et al. | 6,727,579 B1 | 4/2004 | Eldridge et al. |
| 6,490,471 B2 | 12/2002 | Svenson et al. | 6,727,580 B1 | 4/2004 | Eldridge et al. |
| 6,491,968 B1 | 12/2002 | Mathieu et al. | 6,727,716 B1 | 4/2004 | Sharif |
| 6,496,024 B2 | 12/2002 | Schwindt | 6,729,019 B2 | 5/2004 | Grube et al. |
| 6,499,121 B1 | 12/2002 | Roy et al. | 6,734,687 B2 | 5/2004 | Ishitani et al. |
| 6,501,343 B2 | 12/2002 | Miller | 6,741,085 B1 | 5/2004 | Khandros et al. |
| 6,509,751 B1 | 1/2003 | Mathieu et al. | 6,741,092 B2 | 5/2004 | Eldridge et al. |
| 6,520,778 B1 | 2/2003 | Eldridge et al. | 6,744,268 B2 | 6/2004 | Hollman |
| 6,525,555 B1 | 2/2003 | Khandros et al. | 6,753,679 B1 | 6/2004 | Kwong et al. |
| 6,526,655 B2 | 3/2003 | Beaman et al. | 6,759,311 B2 | 7/2004 | Eldridge et al. |
| 6,528,984 B2 | 3/2003 | Beaman et al. | 6,764,869 B2 | 7/2004 | Eldridge et al. |
| 6,528,993 B1 | 3/2003 | Shin et al. | 6,771,806 B1 | 8/2004 | Satya et al. |
| 6,529,844 B1 | 3/2003 | Kapetanic et al. | 6,777,319 B2 | 8/2004 | Grube et al. |
| 6,534,856 B1 | 3/2003 | Dozier, II et al. | 6,778,406 B2 | 8/2004 | Eldridge et al. |
| 6,538,214 B2 | 3/2003 | Khandros | 6,780,001 B2 | 8/2004 | Eldridge et al. |
| 6,538,538 B2 | 3/2003 | Hreish et al. | 6,784,674 B2 | 8/2004 | Miller |
| 6,539,531 B2 | 3/2003 | Miller et al. | 6,784,677 B2 | 8/2004 | Miller |
| 6,549,022 B1 | 4/2003 | Cole, Jr. et al. | 6,784,679 B2 | 8/2004 | Sweet et al. |
| 6,549,106 B2 | 4/2003 | Martin | 6,788,093 B2 | 9/2004 | Aitren et al. |
| 6,551,884 B2 | 4/2003 | Masuoka | 6,788,094 B2 | 9/2004 | Khandros et al. |
| 6,559,671 B2 | 5/2003 | Miller et al. | 6,791,176 B2 | 9/2004 | Mathieu et al. |
| 6,572,608 B1 | 6/2003 | Lee et al. | 6,798,225 B2 | 9/2004 | Miller |
| 6,573,702 B2 | 6/2003 | Marcuse et al. | 6,798,226 B2 | 9/2004 | Altmann et al. |
| 6,597,187 B2 | 7/2003 | Eldridge et al. | 6,806,724 B2 | 10/2004 | Hayden et al. |
| 6,603,323 B1 | 8/2003 | Miller et al. | 6,807,734 B2 | 10/2004 | Eldridge et al. |
| 6,603,324 B2 | 8/2003 | Eldridge et al. | 6,811,406 B2 | 11/2004 | Grube |
| 6,605,941 B2 | 8/2003 | Abe | 6,812,691 B2 | 11/2004 | Miller |
| 6,605,951 B1 | 8/2003 | Cowan | 6,815,963 B2 | 11/2004 | Gleason et al. |
| 6,606,014 B2 | 8/2003 | Miller | 6,816,031 B1 | 11/2004 | Miller |
| 6,606,575 B2 | 8/2003 | Miller | 6,816,840 B1 | 11/2004 | Goodwin, III |
| 6,608,494 B1 | 8/2003 | Bruce et al. | 6,817,052 B2 | 11/2004 | Grube |
| 6,611,417 B2 | 8/2003 | Chen | 6,818,840 B2 | 11/2004 | Khandros |
| 6,615,485 B2 | 9/2003 | Eldridge et al. | 6,822,529 B2 | 11/2004 | Miller |
| 6,616,966 B2 | 9/2003 | Mathieu et al. | 6,825,052 B2 | 11/2004 | Eldridge et al. |
| 6,617,866 B1 | 9/2003 | Ickes | 6,825,422 B2 | 11/2004 | Eldridge et al. |
| 6,621,082 B2 | 9/2003 | Morita et al. | 6,827,584 B2 | 12/2004 | Mathieu et al. |
| 6,621,260 B2 | 9/2003 | Eldridge et al. | 6,835,898 B2 | 12/2004 | Eldridge et al. |
| 6,622,103 B1 | 9/2003 | Miller | 6,836,962 B2 | 1/2005 | Khandros et al. |
| 6,624,648 B2 | 9/2003 | Eldridge et al. | 6,838,885 B2 | 1/2005 | Kamitani |
| 6,627,483 B2 | 9/2003 | Ondricek et al. | 6,838,893 B2 | 1/2005 | Khandros et al. |
| 6,627,980 B2 | 9/2003 | Eldridge | 6,839,964 B2 | 1/2005 | Henson |
| 6,628,503 B2 | 9/2003 | Sogard | 6,845,491 B2 | 1/2005 | Miller et al. |
| 6,633,174 B1 | 10/2003 | Satya et al. | 6,850,082 B2 | 2/2005 | Schwindt |
| 6,640,415 B2 | 11/2003 | Eslamy et al. | 6,856,150 B2 | 2/2005 | Sporck et al. |
| 6,640,432 B1 | 11/2003 | Mathieu et al. | 6,862,727 B2 | 3/2005 | Stevens |
| 6,642,625 B2 | 11/2003 | Dozier, II et al. | 6,864,105 B2 | 3/2005 | Grube et al. |
| 6,643,597 B1 | 11/2003 | Dunsmore | 6,864,694 B2 | 3/2005 | McTigue |
| 6,644,982 B1 | 11/2003 | Ondricek et al. | 6,870,381 B2 | 3/2005 | Grube |
| 6,646,520 B2 | 11/2003 | Miller | 6,882,239 B2 | 4/2005 | Miller |
| 6,655,023 B1 | 12/2003 | Eldridge et al. | 6,882,546 B2 | 4/2005 | Miller |
| 6,657,455 B2 | 12/2003 | Eldridge et al. | 6,887,723 B1 | 5/2005 | Ondricek et al. |
| 6,661,316 B2 | 12/2003 | Hreish et al. | 6,888,362 B2 | 5/2005 | Eldridge et al. |
| 6,664,628 B2 | 12/2003 | Khandros et al. | 6,891,385 B2 | 5/2005 | Miller |
| 6,669,489 B1 | 12/2003 | Dozier, II et al. | 6,900,646 B2 | 5/2005 | Kasukabe et al. |
| 6,672,875 B1 | 1/2004 | Mathieu et al. | 6,900,647 B2 | 5/2005 | Yoshida et al. |

| | | |
|---|---|---|
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,427 B2 | 7/2005 | Gifford et al. |
| 6,914,430 B2 | 7/2005 | Hasegawa et al. |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,948,391 B2 | 9/2005 | Brassell et al. |
| 6,948,981 B2 | 9/2005 | Pade |
| 6,949,942 B2 | 9/2005 | Eldridge et al. |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 2001/0002794 A1 | 6/2001 | Draving et al. |
| 2001/0009061 A1 | 7/2001 | Gleason et al. |
| 2001/0024116 A1 | 9/2001 | Draving |
| 2001/0030549 A1 | 10/2001 | Gleason et al. |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0070745 A1 | 6/2002 | Johnson et al. |
| 2002/0079911 A1 | 6/2002 | Schwindt |
| 2002/0118034 A1 | 8/2002 | Laureanti |
| 2002/0180466 A1 | 12/2002 | Hiramatsu et al. |
| 2003/0010877 A1 | 1/2003 | Landreville et al. |
| 2003/0030822 A1 | 2/2003 | Finarov |
| 2003/0088180 A1 | 5/2003 | Van Veen et al. |
| 2003/0139662 A1 | 7/2003 | Seidman |
| 2003/0139790 A1 | 7/2003 | Ingle et al. |
| 2003/0184332 A1 | 10/2003 | Tomimatsu et al. |
| 2004/0021475 A1 | 2/2004 | Ito et al. |
| 2004/0061514 A1 | 4/2004 | Schwindt et al. |
| 2004/0066181 A1 | 4/2004 | Theis |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0113640 A1 | 6/2004 | Cooper et al. |
| 2004/0134899 A1 | 7/2004 | Hiramatsu et al. |
| 2004/0162689 A1 | 8/2004 | Jamneala et al. |
| 2004/0193382 A1 | 9/2004 | Adamian et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0246004 A1 | 12/2004 | Heuermann |
| 2004/0251922 A1 | 12/2004 | Martens et al. |
| 2005/0030047 A1 | 2/2005 | Adamian |
| 2005/0062533 A1 | 3/2005 | Vice |

FOREIGN PATENT DOCUMENTS

| | | |
|---|---|---|
| DE | 19542955 | 5/1997 |

| | | |
|---|---|---|
| DE | 19749687 | 5/1998 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0945736 | 9/1999 |
| GB | 579665 | 8/1946 |
| GB | 2014315 | 8/1979 |
| GB | 2179458 | 3/1987 |
| JP | 53037077 | 4/1978 |
| JP | 55115383 | 9/1980 |
| JP | 5691503 | 7/1981 |
| JP | 56088333 | 7/1981 |
| JP | 57075480 | 5/1982 |
| JP | 57163035 | 10/1982 |
| JP | 57171805 | 10/1982 |
| JP | 62098634 | 5/1987 |
| JP | 62107937 | 5/1987 |
| JP | 62239050 | 10/1987 |
| JP | 02124469 | 5/1990 |
| JP | 02135804 | 5/1990 |
| JP | 3196206 | 8/1991 |
| JP | 03228348 | 10/1991 |
| JP | 04130639 | 5/1992 |
| JP | 04159043 | 6/1992 |
| JP | 04206930 | 7/1992 |
| JP | 05082631 | 4/1993 |
| JP | 5157790 | 6/1993 |
| JP | 5166893 | 7/1993 |
| JP | 6154238 | 6/1994 |
| JP | 7005078 | 1/1995 |
| JP | 7012871 | 1/1995 |
| JP | 8035987 | 2/1996 |
| JP | 08330401 | 12/1996 |
| JP | 09127432 | 5/1997 |
| JP | 10116866 | 5/1998 |
| JP | 11023975 | 1/1999 |
| JP | 2002243502 | 8/2002 |
| SU | 1195402 | 11/1985 |
| WO | WO80/00101 | 1/1980 |
| WO | WO94/10554 | 5/1994 |
| WO | WO98/07040 | 2/1998 |
| WO | WO01/07207 | 2/2001 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1, Committee Personnel, "IRE Standards on Methods of Measuring Noise in Linear Twoports, 1959," Proc. IRE, vol. 48, pp. 60-68, Jan. 1960, pp. 32-40.
Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.
Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentation and Measurement, Jun. 1973.
Daly, P., "Polar Geometry Waveguides by finite-element Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, 1975, pp. 17-22-17-27.
Bry, A., et al, "Bypass Capacitor for Chip Probe," IBM Technical Disclosure Bulletin, vol. 18, No. 11, Apr. 1976.
Skobern, J.R., "Subminiature High-Frequency Probe," IBM Technical disclosure Bulletin, vol. 19, No. 10, Mar. 1977.
Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertragungstechnik," Elektronik 8/ Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.
Maury Microwave Corp., "Transistor Test Fixture (TTF) Inserts, Calibration & Check Devices, MT951, MT952, MT953 Series," Advanced Data 4T-002, Sep. 20, 1982, pp. 1-2.
Maury Microwave Corp., "Transistor Test Fixture (TTF)," MT950 Series, Advanced data 4T-001, Oct. 7, 1982.
Abbott, D.A., et al., "Automatic noise figure measurements with computer control and correction," 8054 Radio and Electronic Engineer vol. 52, Oct. 1982, pp. 468-474.
Swain, Howard L. et al., "Noise Figure Meter Sets Record for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTT-S Digest 1987, pp. 353-356.
Izadian, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate Measurements of High-speed Package and Interconnect Parasitics," IEEE 1988 Custom Integrated Circuits Conference, pp. 23.3.1-23.3.6.
Fraser, Artur, et al., "GHz On-Silicon-Wafer Probing Calibration Methods," Paper 7.6, IEEE 1988 Bipolar Circuits & Technology Meeting, pp. 154-157.
Modolo, John A., et al, "Wafer level high-frequency measurements of photodetector characteristics," Applied Optics, vol. 27 pp. 3059-3061, Aug. 1988.
Design Technique, "Adjustable Test Fixture," 1988.
Tong, Peter R., et al., "Noise Measurements at MM-Wave Frequencies," 176 Microwave Journal 31, Jul. 1988.
Barsotti, C., et al., "New Probe Cards Replace Needle Types," Semiconductors International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplanar Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly complaint, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretica Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Cascade Microwave, "Introducing the World's First Microwave Wafer Probing Equipment," 4 pages, 1983.

Malm, R.L. "Reduction of Stray of Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's 1980 IEEE MTT-S International Microwave Symposium Digest, Washington, DC, May 28-30, 1980.

\* cited by examiner

SHIELDED PROBE FOR TESTING A DEVICE UNDER TEST

CROSS-REFERENCE TO RELATED APPLICATIONS

This application is a continuation of U.S. patent application Ser. No. 10/445,174, filed May 23, 2003, now U.S. Pat. No. 7,057,404.

BACKGROUND OF THE INVENTION

The present invention relates to probe measurement systems for measuring the electrical characteristics of integrated circuits or other microelectronic devices at high frequencies.

There are many types of probing assemblies that have been developed for the measurement of integrated circuits and other forms of microelectronic devices. One representative type of assembly uses a circuit card on which the upper side are formed elongate conductive traces that serve as signal and ground lines. A central opening is formed in the card, and a needle-like probe tip is attached to the end of each signal trace adjacent the opening so that a radially extending array of downwardly converging needle-like tips is presented by the assembly for selective connection with the closely spaced pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

In order to obtain device measurements at somewhat higher frequencies than are possible with the basic probe card system described above, various related probing systems have been developed. Such systems are shown, for example, in Evans U.S. Pat. No. 3,849,728; Kikuchi Japanese Publication No. 1-209,380; Sang et al. U.S. Pat. No. 4,749,942; Lao et al. U.S. Pat. No. 4,593,243; and Shahriary U.S. Pat. No. 4,727,319. Yet another related system is shown in Kawanabe Japanese Publication No. 60-223,138 which describes a probe assembly having needle-like tips where the tips extend from a coaxial cable-like structure instead of a probe card. A common feature of each of these systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form transmission line structures of stripline type. As a practical matter, however, it is difficult to join the thin vertical edge of each blade to the corresponding trace on the card while maintaining precisely the appropriate amount of face-to-face spacing between the blades and precisely the correct pitch between the ends of the needle-like probe tips.

One type of probing assembly that is capable of providing a controlled-impedance low-loss path between its input terminal and the probe tips is shown in Lockwood et al. U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of ferrite-containing microwave absorbing material are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test, and broadband signals that are within the range, for example, of DC to 18 gigahertz can travel with little loss from one end of the probe assembly to another along the coplanar transmission line formed by each ground-signal-ground trace pattern. The probing assembly shown in Lockwood et al. fails to provide satisfactory electrical performance at higher microwave frequencies and there is a need in microwave probing technology for compliance to adjust for uneven probing pads.

To achieve improved spatial conformance between the tip conductors of a probe and an array of non-planar device pads or surfaces, several high-frequency probing assemblies have been developed. Such assemblies are described, for example, in Drake et al. U.S. Pat. No. 4,894,612; Coberly et al. U.S. Pat. No. 4,116,523; and Boll et al. U.S. Pat. No. 4,871,964. The Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible nonceramic material. The moderately flexible substrate permits, at least to a limited extent, independent flexure of each tooth relative to the other teeth so as to enable spatial conformance of the trace ends to slightly non-planar contact surfaces on a device-under-test. However, the Drake et al. probing assembly has insufficient performance at high frequencies.

With respect to the probing assembly shown in Boll et al., as cited above, the ground conductors comprise a pair of leaf-spring members the rear portions of which are received into diametrically opposite slots formed on the end of a miniature coaxial cable for electrical connection with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in spaced apart generally centered position between the respective forward portions of the leaf-spring members and thereby forms, in combination with these leaf-spring members, a rough approximation to a ground-signal-ground coplanar transmission line structure. The advantage of this particular construction is that the pin-like extension of the cable's center conductor and the respective forward portions of the leaf-spring members are each movable independently of each other so that the ends of these respective members are able to establish spatially conforming contact with any non-planar contact areas on a device being tested. On the other hand, the transverse-spacing between the pin-like member and the respective leaf-spring members will vary depending on how forcefully the ends of these members are urged against the contact pads of the device-under-test. In other words, the transmission characteristic of this probing structure, which is dependent on the spacing between the respective tip members, will vary in an ill-defined manner during each probing cycle, especially at high microwave frequencies.

Figure 1:
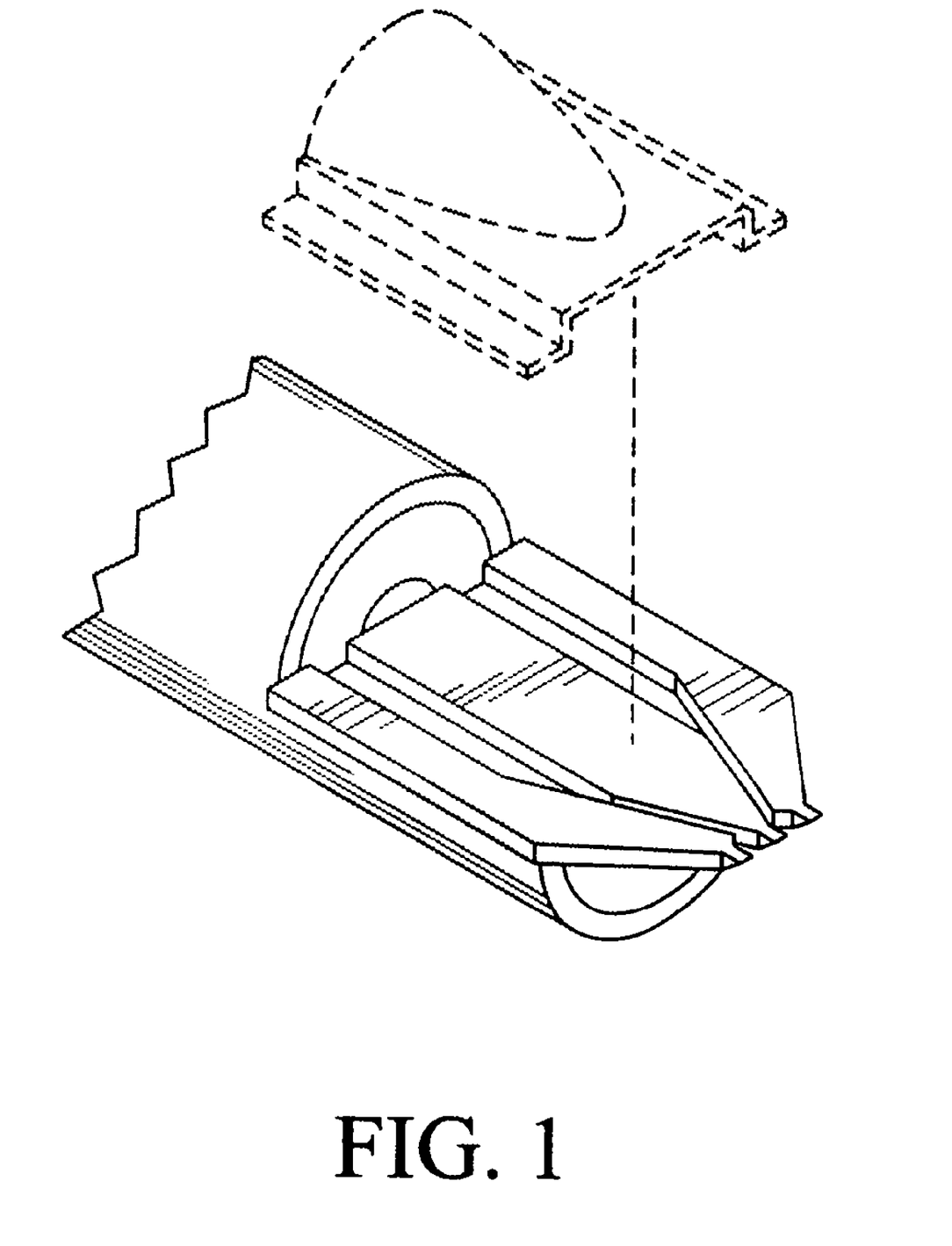
FIG. 1 illustrates an existing probe.

Burr et al., U.S. Pat. No. 5,565,788, disclose a microwave probe that includes a supporting section of a coaxial cable including an inner conductor coaxially surrounded by an outer conductor. A tip section of the microwave probe includes a central signal conductor and one or more ground conductors generally arranged normally in parallel relationship to each other along a common plane with the central signal conductor so as to form a controlled impedance structure. The signal conductor is electrically connected to the inner conductor and the ground conductors are electrically connected to the outer conductor, as shown in FIG. 1. A shield member is interconnected to the ground conductors and covers at least a portion of the signal conductor on the bottom side of the tip section. The shield member is tapered toward the tips with an opening for the tips of the conductive fingers. The signal conductor and the ground conductors each have an end portion extending beyond the shield member and the end portions are able to resiliently flex, despite the presence of the shielding member, relative to each other and away from their common plane so as to permit probing devices having non-planar surfaces.

Figure 2A:
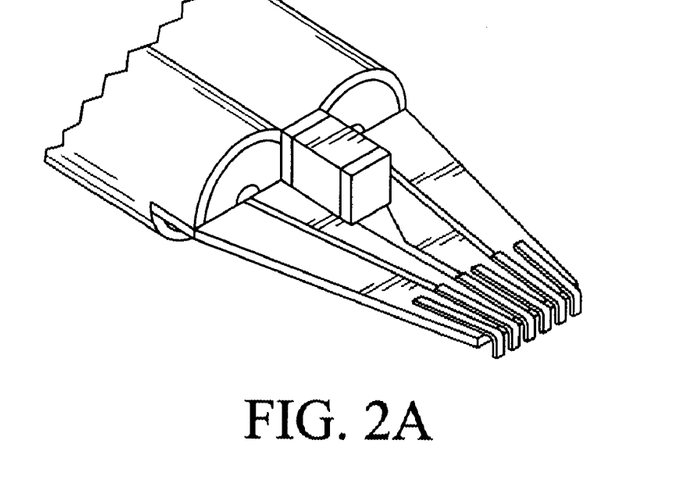
FIGS. 2A-2C illustrate another existing probe.
Figure 2B:
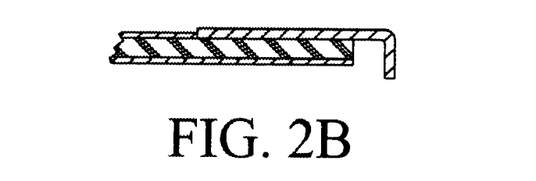
Figure 2C:
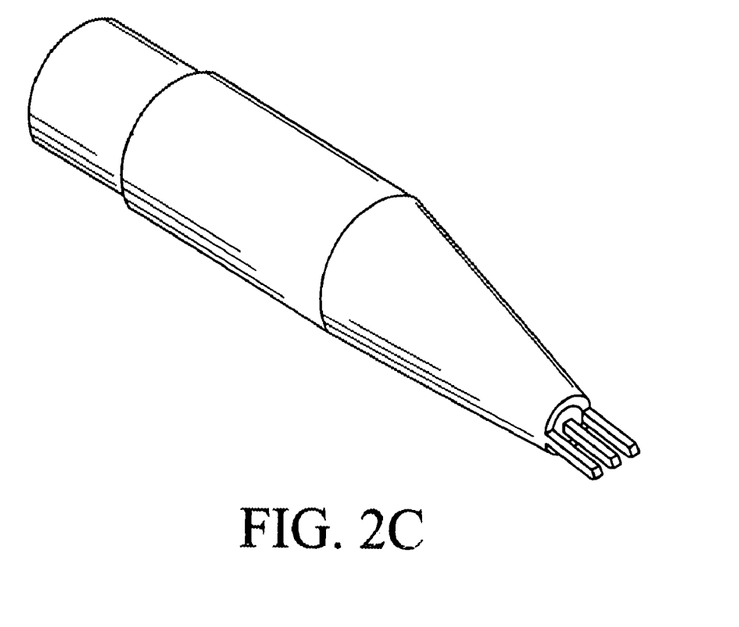

In another embodiment, Burr et al. disclose a microwave probe that includes a supporting section of a coaxial cable including an inner conductor coaxially surrounded by an outer conductor, as shown in FIGS. 2A, 2B, and 2C. A tip section of the microwave probe includes a signal line extending along the top side of a dielectric substrate connecting a probe finger with the inner conductor. A metallic shield may be affixed to the underside of the dielectric substrate and is electrically coupled to the outer metallic conductor. Ground-connected fingers are placed adjacent the signal line conductors and are connected to the metallic shield by way of vias through the dielectric substrate. The signal conductor is electrically connected to the inner conductor and the ground plane is electrically connected to the outer conductor. The signal conductor and the ground conductor fingers (connected to the shield via vias) each have an end portion extending beyond the shield member and the end portions are able to resiliently flex, despite the presence of the shielding member, relative to each other and away from their common plane so as to permit probing devices having non-planar surfaces. While the structures disclosed by Burr et al. are intended to provide uniform results of a wide frequency range, they unfortunately tend to have non-uniform response characteristics at high microwave frequencies.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

The present inventors considered the co-planar fingered probing devices disclosed by Burr et al., including the co-planar finger configuration and the microstrip configuration with fingers extending therefrom. In both cases, electromagnetic fields are created during probing between the fingers. These electromagnetic fields encircle each of the fingers, electrically couple the signal finger to the ground fingers, and electrically couple the ground fingers one another. While the probing device is being used for probing, the resulting electromagnetic fields surrounding the fingers interact with the wafer environment. While probing in different regions of the wafer, the interaction between the electromagnetic fields around the fingers and the wafer change, typically in an unknown manner. With a significant unknown change in the interaction it is difficult, if not impossible, to accurately calibrate out the environmental conditions while probing a device under test.

When multiple probes are being simultaneously used for probing the same area of the wafer, the probe tips come into close proximity with one another and result in additional coupling between the probes, normally referred to as crosstalk. In addition, the region between the support for the fingers, such as a dielectric substrate, and the extended portion of the fingers results in a significant capacitance, which impedes high frequency measurements.

The present inventors were surprised to determine that the microstrip structure disclosed by Burr et al. further does not calibrate well on calibration test substrates at very high frequencies, such as in excess of 70 GHz. This calibration is independent of potential interaction with a wafer at a later time during actual probing of a device under test. After examination of this unexpected non-calibration effect the present inventors speculate that an energy is created in an "undesired mode", other than the dominant field modes, at such extreme frequencies. This "undesired mode" results in unexpected current leakages from the signal path thus degrading the signal integrity. The present inventors further speculate that this "undesired mode" involves resonating energy in the ground plane as a result of discontinuities in the ground path, including for example, the connection between the ground plane and the external portion of the cable, and the inductance in the ground plane. This ground plane resonant energy results in unpredictable changing of the energy in the signal path to the device under test, thus degrading performance. This degradation wasn't apparent at lower operating frequencies, so accordingly, there was no motivation to modify existing probe designs in order to eliminate or otherwise reduce its effects.

Figure 3:
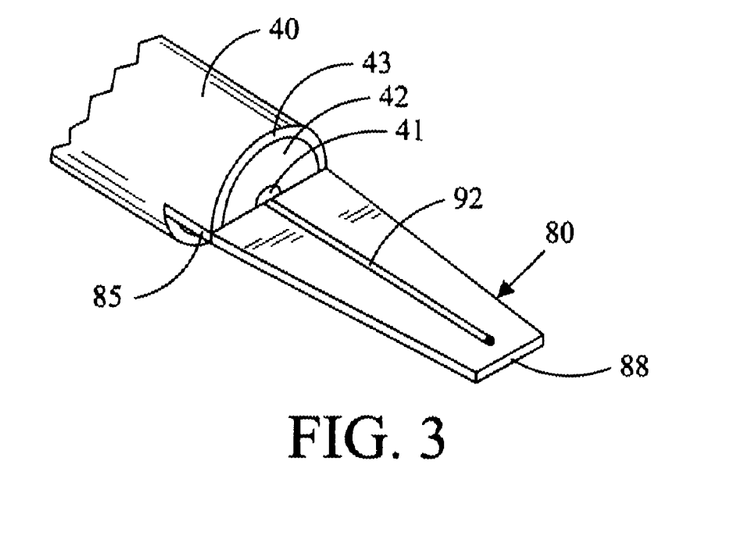
FIG. 3 illustrates one embodiment of a probe.

Referring to FIG. 3, a semi-rigid coaxial cable 40 is electrically connected at its rearward end to a connector (not shown). The coaxial cable 40 normally includes an inner conductor 41, a dielectric material 42, and an outer conductor 43. The coaxial cable 40 may likewise include other layers of materials, as desired. The forward end of the cable 40 preferably remains freely suspended and, in this condition, serves as a movable support for the probing end of the probe.

Figure 4:
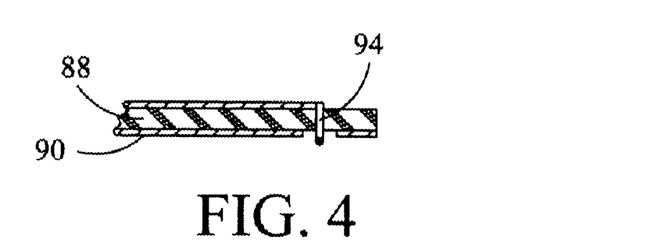
FIG. 4 illustrates a side view of a portion of the probe of FIG. 3.

A microstrip style probe tip 80 includes a dielectric substrate 88 that is affixed to the end of the coaxial cable 40. The underside of the cable 40 is cut away to form a shelf 85, and the dielectric substrate 88 is affixed to the shelf 85. Alternatively, the dielectric substrate 88 may be supported by an upwardly facing shelf cut away from the cable or the end of the cable without a shelf. Referring also to FIG. 4, a conductive shield 90, which is preferably planar in nature, is affixed to the bottom of the substrate 88. The conductive shield 90, may be for example, a thin conductive material (or otherwise) that is affixed to the substrate 88. By using a generally planar conductive material having a low profile the shield 90 is less likely to interfere with the ability to effectively probe a device under test by accidently contacting the device under test. The conductive shield 90 is electrically coupled to the outer conductor 43 to form a ground plane. The other conductor 43 is typically connected to the ground, though the outer conductor 43 may be provided with any suitable voltage potential (either DC or AC). The conductive shield 90 preferably covers all of the lower surface of the substrate 88. Alternatively, the conductive shield 90 may cover greater than 50%, 60%, 70%, 80%, 90%, and/or the region directly under a majority (or more) of the length of a conductive signal trace on the opposing side of the substrate 88.

One or more conductive signal traces 92 are supported by the upper surface of the substrate 88. The conductive traces 92, may be for example, deposited using any technique or otherwise supported by the upper surface of the substrate. The conductive trace(s) 92 is electrically interconnected to the inner conductor 41 of the coaxial cable 40. The inner conductor 41 of the coaxial cable 40 and the conductive trace(s) 92 normally carries the signal to and from the device under test. The conductive trace(s) 92 together with the shield layer 90 separated by a dielectric material 88 form one type of a microstrip transmission structure. Other layers above, below, and/or between the shield layer 90 and the conductive trace 92 may be included, if desired.

To reduce the effects of the aforementioned unexpected high frequency signal degradation, the present inventors determined that the signal path may include a conductive via 94 passing through the substrate 88. The conductive via 94 provides a manner of transferring the signal path from the upper surface of the substrate to the lower surface of the substrate. The conductive via 94 avoids the need for using a conductive finger extending out from the end of the substrate 88 that would otherwise result in a significant capacitance between the extended finger and the end of the substrate 88. The conductive via 94 provides a path from one side of the substrate 88 to the other side of the substrate 88 in a manner free from an air gap between the conductive via 94 and the substrate 88 for at least a majority of the thickness of the substrate 88. In addition, the shield layer 90 preferably extends beyond the via 94 to provide additional shielding.

Figure 5:
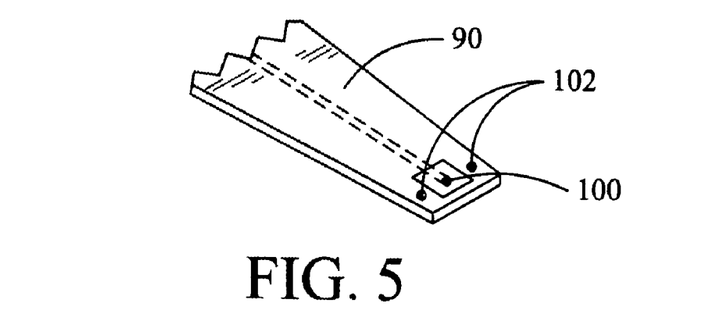
FIG. 5 illustrates a bottom view of a portion of the probe of FIG. 3.

Referring also to FIG. 5, the lower surface of the substrate 88 illustrates a contact bump 100 electrically connected to the via 94 and the trace 92 extending below the lower surface of the substrate 88 and the shield 90 which may be used to make contact with the device under test during probing. The conductive shield 90 may include an "patterned" section around the contact "bump" 100 so that the shield layer 90 and the signal path are free from being electrically interconnected (e.g., the shield layer 90 may be greater than 50%, 75%, or laterally surrounding all of the contact at some point). It is to be understood that the contact may take any suitable form, such as for example a bump, a patterned structure, a conductive structure, a needle structure, or an elongate conductor. The conductive shield 90 may laterally encircle the conductive bump which increases the resistance to external electromagnetic fields. Also, the conductive shield 90 extending beyond the conductive bump 100 reduces the crosstalk from other probes. For some probing applications, one or more shield 90 contacts 102 may be provided, if desired. The shield layer and the conductive trace are normally constructed to provide a microstrip transmission line controlled impedance structure. While typically the signal line has a test signal and the shield has a ground potential, the two conductive paths may likewise be any other configuration, such as balanced inputs which vary with respect to ground.

Figure 6:
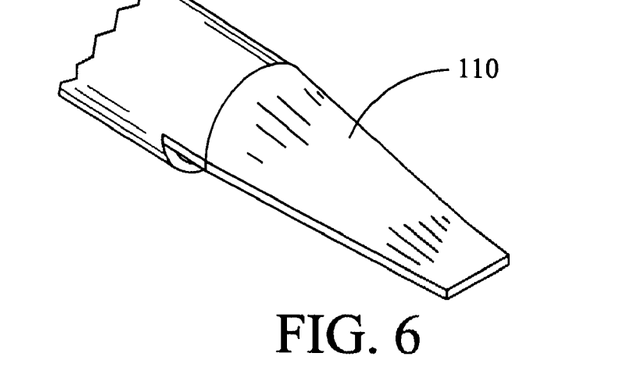
FIG. 6 illustrates another embodiment of a probe.

Referring to FIG. 6, the probe may employ an outer cone shaped upper shield 10. The outer conductor 43 of the coaxial cable is connected to the upper shield 110 is therefore electrically connected to ground. This design provides a smooth transition between the coaxial cable and the end of the probe. The probe is therefore shielded as it transitions to the tip of the cone portion.

The upper shield 10 has a tapered cylindrical portion whose forward end is a tapered tip and whose rear end has a contour that is in continuous contact with the outer coaxial conductor along its circumference so that there is no gap between the outer conductor and portions of the shield that could create fringing fields that could effect probe measurements. Likewise, any other shape may be used for the shield 110, as desired. In addition, the forward end preferably extends past the via and forms a substantially closed region so that there is reduced fringing fields at the forward end. The shield reduces parasitic coupling to any external structure and the construction of the shield as a single piece of metal reduces complexity of assembly. The shield is preferably made of a thin foil and is capable of being formed by a fabrication process. The shield may also be deposited or made of other material.

The lower shield member 90 extends underneath the conductive trace between the fingers and the chuck holding the device under test. The shield therefore helps to block the generation of ground plane resonant modes that can otherwise interfere with and degrade the signal from the device under test.

Figure 7:
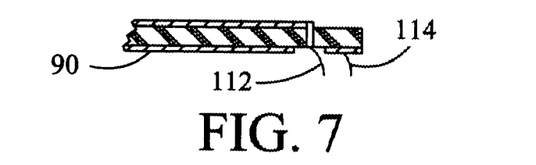
FIG. 7 illustrates yet another embodiment of a probe.

Referring to FIG. 7, in an alternative embodiment a conductive finger 112 or other elongate conductive element may be provided that is electrically interconnected to the via. One or more additional ground fingers 114 may be electrically connected to the lower shield material. If desired, each respective finger may include a cantilevered portion that extends down away from the substrate. The cantilevered portions are preferably arranged in transversely spaced apart relationship to each other so as to cooperatively form a controlled impedance transmission line in order that a low loss transition can be made between the respective conductors on the cable and the respective pads on the device-under test.

While the use of an upper shield 110 that includes a curved surface provides an improvement to signal integrity, the changes in the structure of the upper shield tend to introduce some limitations into the signal integrity at high frequencies, thus impeding performance. For example, the changes in the height of the upper shield changes the electromagnetic field pattern along the length of the signal conductor. In addition, increased manufacturing complexity occurs with the upper shield. Furthermore, in most cases microwave microstrip transmission structures are enclosed in a housing, such as a conductive case, and accordingly there is reduced motivation to include an upper shield structure.

To further increase the performance at high frequencies the present inventors considered the effects of the substrate material. In many cases the dielectric constant of the dielectric substrate material is high, such as $Al_2O_3$ which has a 9.9 dielectric constant. Materials with a high dielectric constant have a tendency to concentrate the electromagnetic fields therein, thus decreasing the electromagnetic fields susceptible to influence by other devices. In addition, the thickness of the substrate is typically 250-500 microns to provide mechanical stability. Thus the fields tend to concentrate within the substrate.

Figure 8:
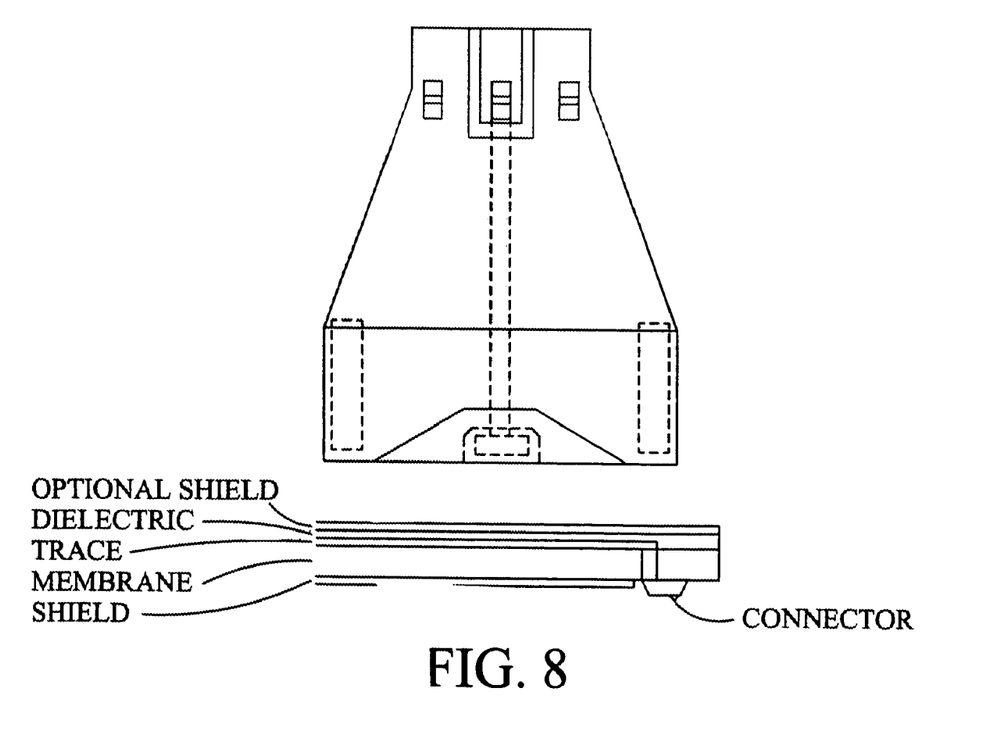
FIG. 8 illustrates still another embodiment of a probe.

Referring to FIG. 8, while considering such substrates the present inventors came to the realization that the flexible membrane substrate may be substituted for the more rigid substrate 88. An example of membrane material is described in U.S. Pat. No. 5,914,613, incorporated by reference herein together will all other references cited herein incorporated by reference herein. In general, membrane based probes are characterized by a flexible (or semi-flexible) substrate with traces supported thereon together with contacting portions being supported thereon. The membrane portion of the probe may be constructed from a sacrificial substrate into which is created a depression. Into this depression is located conductive material, traces are located thereon if desired, and flexible dielectric material is located on or under the traces. Thereafter, the sacrificial substrate is removed leaving the probe tip, traces, and membrane material. The contacting portions come into contact with the device under test and the traces are normally on the opposing side of the membrane connected to the contacting portions using vias. In many cases, the membrane technology may be significantly thinner than ceramic based substrates, (see, e.g., substrate 88) such as 40, 30, 20, 10, 5, or 3 microns or less. Normally the dielectric constant of the membrane material is 7 or less, sometimes less than 6, 5, or 4 depending on the particular material used. While normally using a lower dielectric constant substrate is unsuitable, using a significantly thinner substrate together with a lower dielectric constant substrate raises the theoretical frequency range of effective signal transmission to 100's of GHz. The significantly thinner substrate material permits positioning the lower shield material significantly closer to the signal traces than the relatively thick ceramic substrate, and therefore tends to more tightly confine the electromagnetic fields there between. With a tight confinement of the electric fields in the membrane material, the present inventors determined that the high frequency performance of the membrane material may be increased by locating an upper shield material above the membrane material. Moreover, the upper shield material should likewise be correspondingly close to the signal path, so the curved upper shield material positioned at a significant distance from the signal trace previously used may not normally be sufficient. Accordingly, the shield material should be patterned on the top of the membrane material with a dielectric between the signal trace and the upper shield material. In many cases, the distance between the signal trace and the upper shield directly above the signal trace should be no more than 10 times the distance between the signal trace and the lower shield material. More preferably, the aforementioned distance would be preferably 7, 5, 4, or 2 times.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe comprising:
   (a) a flexible membrane;
   (b) an elongate conductor suitable to be electrically interconnected to a test signal supported by a first side of said membrane;
   (c) a conductive member suitable to be electrically interconnected to a ground signal supported by a second side of said membrane wherein said conductive member is under a majority of the length of said elongate conductor;
   (d) a conductive path between said first side of said membrane and said second side of said membrane in a manner free from an air gap between the conductive path and the end of said membrane for at least a majority of the thickness of said membrane and said electrically connected to the elongate conductor and free from electrical interconnection with said conductive member; and
   (e) a contact electrically interconnected to said conductive path for testing a device under test.

2. The probe of claim 1 wherein said elongate conductor is electrically interconnected to a central conductor of a coaxial cable.

3. The probe of claim 2 wherein said conductive member is electrically connected to a conductor surrounding said central conductor of said coaxial cable.

4. The probe of claim 3 wherein said membrane is supported by said coaxial cable.

5. The probe of claim 4 wherein said membrane is supported by a shelf of said coaxial cable.

6. The probe of claim 1 wherein said conductive member is substantially planar.

7. The probe of claim 1 further comprising a second conductive member suitable for electrical interconnection to a ground signal, said second conductive member supported on a side of said elongate conductor opposite said membrane.

8. The probe of claim 7 wherein a dielectric separates said second conductive member and said elongate conductor.

9. The probe of claim 1 wherein said membrane has a dielectric constant less than 7.

10. The probe of claim 1 wherein said membrane has a dielectric constant less than 5.

11. The probe of claim 1 wherein said membrane has a dielectric constant less than 4.

12. The probe of claim 1 wherein said membrane has a dielectric constant less than 2.

13. The probe of claim 1 wherein said ground signal is zero volts.

14. The probe of claim 1 wherein said conductive member covers greater than 50% of said second side of said membrane.

15. The probe of claim 1 wherein said conductive member covers greater than 60% of said second side of said membrane.

16. The probe of claim 1 wherein said conductive member covers greater than 70% of said second side of said membrane.

17. The probe of claim 1 wherein said conductive member covers greater than 80% of said second side of said membrane.

18. The probe of claim 1 wherein said conductive member covers greater than 90% of said second side of said membrane.

19. The probe of claim 1 wherein said conductive member, said elongate conductor, and said membrane collectively form a microstrip transmission structure.

20. The probe of claim 1 wherein said conductive path is a via through said membrane.

21. The probe of claim 1 wherein said conductive member laterally surrounds at least 50% of said contact.

22. The probe of claim 1 wherein said conductive member laterally surrounds at least 75% of said contact.

23. The probe of claim 1 wherein said conductive member laterally surrounds at least 100% of said contact.

24. The probe of claim 1 wherein said contact is in the form of a bump.

25. The probe of claim 1 wherein said membrane has a thickness less than 40 microns.

26. The probe of claim 1 wherein said membrane has a thickness less than 30 microns.

27. The probe of claim 1 wherein said membrane has a thickness less than 20 microns.

28. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 10 times the distance between said elongate conductor and said shield member.

29. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 7 times the distance between said elongate conductor and said shield member.

30. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 5 times the distance between said elongate conductor and said shield member.

31. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 4 times the distance between said elongate conductor and said shield member.

32. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 2 times the distance between said elongate conductor and said shield member.

33. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 10 times the distance between said elongate conductor and said shield member.

34. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 7 times the distance between said elongate conductor and said shield member.

35. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 5 times the distance between said elongate conductor and said shield member.

36. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 4 times the distance between said elongate conductor and said shield member.

37. The probe of claim 1 further comprising a conductive shield member arranged proximate said elongate conductor on a side of said elongate conductor opposite of said conductive member and suitable to be electrically interconnected to a ground signal, wherein a distance between said elongate conductor and said conductive member is less than 2 times the distance between said elongate conductor and said shield member.

38. A probe comprising:
(a) a non-rigid membrane supporting an elongate conductor on a first side of said membrane and a conductive member supported by a second side of said membrane wherein said conductive member is under a majority of the length of said elongate conductor;
(b) a conductive path between said first side of said membrane and said second side of said membrane in a region within the periphery of said membrane for at least a majority of the thickness of said membrane said conductive path electrically connected to said elongate conductor and free from electrical interconnection with said conductive member; and
(c) a contact electrically interconnected to said conductive path for testing a device under test.

39. The probe of claim 38 wherein said elongate conductor is electrically interconnected to a central conductor of a coaxial cable.

40. The probe of claim 39 wherein said conductive member is electrically connected to a conductor surrounding said central conductor of said coaxial cable.

41. The probe of claim 38 wherein said dielectric membrane has a dielectric constant less than 7.

42. The probe of claim 38 wherein said dielectric membrane has a dielectric constant less than 5.

43. The probe of claim 38 wherein said dielectric membrane has a dielectric constant less than 4.

44. The probe of claim 38 wherein said dielectric membrane has a dielectric constant less than 2.

45. The probe of claim 38 wherein said conductive member covers greater than 50% of said second side of said membrane.

46. The probe of claim 38 wherein said conductive member covers greater than 60% of said second side of said membrane.

47. The probe of claim 38 wherein said conductive member covers greater than 70% of said second side of said membrane.

48. The probe of claim 38 wherein said conductive member covers greater than 80% of said second side of said membrane.

49. The probe of claim 38 wherein said conductive member covers greater than 90% of said second side of said membrane.

50. The probe of claim 38 wherein said conductive member, said elongate conductor, and said membrane collectively form a microstrip transmission structure.

51. The probe of claim 38 wherein said membrane has a thickness less than 40 microns.

52. The probe of claim 38 wherein said membrane has a thickness less than 20 microns.

53. The probe of claim 38 wherein said membrane has a thickness less than 10 microns.

* * * * *